(12) United States Patent
Chi et al.

(10) Patent No.: US 7,573,303 B1
(45) Date of Patent: Aug. 11, 2009

(54) DIGITALLY CONTROLLED SYSTEM ON-CHIP (SOC) CLOCK GENERATOR

(75) Inventors: Ji Fu Chi, Shanghai (CN); Yi Li, Shanghai (CN)

(73) Assignee: Integrated Device Technology, Inc, San Jose, CA (US)

( * ) Notice: Subject to any disclaimer, the term of this patent is extended or adjusted under 35 U.S.C. 154(b) by 27 days.

(21) Appl. No.: 11/781,452

(22) Filed: Jul. 23, 2007

Related U.S. Application Data

(60) Provisional application No. 60/943,004, filed on Jun. 8, 2007.

(51) Int. Cl.
*H03B 21/00* (2006.01)
*H03L 7/06* (2006.01)

(52) U.S. Cl. .................................. 327/105; 327/156

(58) Field of Classification Search .............. 327/105, 327/117, 156–159, 147–150
See application file for complete search history.

(56) References Cited

U.S. PATENT DOCUMENTS

| 6,144,674 | A | 11/2000 | Peres et al. |
|---|---|---|---|
| 6,204,812 | B1 * | 3/2001 | Fattouche .................. 342/457 |
| 6,249,189 | B1 * | 6/2001 | Wu et al. .................... 331/18 |
| 6,297,703 | B1 * | 10/2001 | Martin et al. ................. 331/2 |
| 6,480,047 | B2 * | 11/2002 | Abdel-Maguid et al. .... 327/161 |
| 6,791,386 | B2 | 9/2004 | Saeki |
| 7,142,008 | B1 * | 11/2006 | Sanders ....................... 326/38 |
| 7,155,188 | B2 * | 12/2006 | Noboru et al. ............. 455/255 |
| 7,212,050 | B2 | 5/2007 | Meltzer |
| 7,216,249 | B2 | 5/2007 | Fujiwara et al. |
| 7,227,918 | B2 | 6/2007 | Aung et al. |
| 7,228,451 | B1 | 6/2007 | Nguyen et al. |

* cited by examiner

*Primary Examiner*—Dinh T. Le
(74) *Attorney, Agent, or Firm*—Stanley J. Pawlik; Glass & Associates

(57) ABSTRACT

A clock generator includes a clock circuit and a voltage-controlled oscillator in a phase-locked loop. The clock circuit monitors input clock signals and selects one of the input clock signals based on characteristics of the input clock signals. The voltage-controlled oscillator generates a reference clock signal based on the selected clock signal. The clock circuit also includes synthesizers for generating clock signals, each of which has a frequency being a non-integer multiple of a frequency of the reference clock signal. Additionally, the clock circuit individually offsets the clock signals generated by the synthesizers relative to the reference clock signal. The clock generator is capable of switching the input clock signal during operation of the clock generator while maintaining the reference clock signal. Further, the clock generator is programmable to control operation of the clock circuit.

20 Claims, 7 Drawing Sheets

DIGITALLY CONTROLLED SYSTEM ON-CHIP (SOC) CLOCK GENERATOR

CROSS-REFERENCE TO RELATED APPLICATION

The present application claims benefit of U.S. Provisional Application Ser. No. 60/943,004, filed Jun. 8, 2007, which is incorporated herein by reference in its entirety.

BACKGROUND

In distributed third-generation (3G) NodeB applications, a base band unit (BBU) is typically linked to a remote radio unit (RRU) via an optical fiber. The optical fiber carries a baseband signal between the base band unit and the remote radio unit as well as information for synchronizing the base band unit with the remote radio unit. Further, the remote radio unit includes a clock circuit for generating clock signals having different frequencies and offsets from each other.

In known third-generation NodeB applications, the remote radio unit includes a clock circuit implemented in discrete components, such as field-programmable gate arrays (FPGAs), central processing units (CPUs), digital signal processors (DSPs), analog-to-digital converters (ADC), and digital-to-analog converters (DAC). Additionally, the clock circuit includes multiple discrete voltage-controlled crystal oscillators (VCXOs). Because the components in the clock circuit are discrete, the clock signals generated by the clock circuit may have a level of phase noise that is higher than desired. Further, the use of discrete components results in a high part count and a high cost of manufacture for the clock circuit.

In light of the above, a need exists for a low-cost clock generator that generates clock signals having different frequencies, different offsets, and low phase noise.

SUMMARY

In various embodiments, a clock generator includes a clock circuit and a voltage-controlled oscillator in a phase-locked loop. The clock circuit monitors input clock signals and selects one of the input clock signals based on characteristics of the input clock signals. The voltage-controlled oscillator generates a reference clock signal based on the selected clock signal. The clock circuit also includes synthesizers for generating clock signals, each of which has a frequency being a non-integer multiple of a frequency of the reference clock signal. Additionally, the clock circuit individually offsets the clock signals generated by the synthesizers relative to the reference clock signal. The clock generator is capable of switching the input clock signal during operation of the clock generator while maintaining the reference clock signal. Further, the clock generator is programmable to control operation of the clock circuit.

In various embodiments, the clock circuit is implemented in an integrated circuit, which reduces the phase noise of the clock signals as well as the cost of manufacturing the clock generator. For example, the clock circuit may be implemented as a System-on-Chip (SOC) and the voltage-controlled oscillator may be a voltage-controlled crystal oscillator external of the integrated circuit. In these embodiments, components of the clock circuit are matched in performance over process, voltage, and temperature variations of the integrated circuit to improve accuracy of the generated clock signals. Further, the clock generator need only have a single external voltage-controlled oscillator, which reduces part count and cost of the clock generator and further improves the accuracy of the generated clock signals.

A clock generator, in accordance with one embodiment, includes a voltage-controlled oscillator and a clock circuit. The clock circuit in conjunction with the voltage-controlled oscillator form a phase-locked loop. The clock circuit includes a clock monitor and a cascade fraction synthesizer. The clock monitor is configured to select an input clock signal from a plurality of input clock signals. The voltage-controlled oscillator is configured to generate a reference clock signal based on the selected input clock signal. The cascade fraction synthesizer is configured to generate an output clock signal based on the reference clock signal, which has a frequency that is a non-integer multiple of the frequency of the reference clock signal.

A method of generating clock signals, in accordance with one embodiment, includes selecting an input clock signal from a plurality of input clock signals, generating a control signal based on the selected input clock signal, and generating a reference clock signal based on the control signal. The method further includes generating an output clock signal having a non-integer frequency multiple of the reference clock signal, synchronizing the output clock signal with the reference clock signal, and generating an offset in the output clock signal relative to the reference clock signal.

A clock generator, in accordance with one embodiment, includes a means for selecting an input clock signal from a plurality of input clock signals, a means for generating a control signal based on the selected input clock signal, and a means for generating a reference clock signal based on the control signal. The clock generator further includes a means for generating at least one output clock signal having a non-integer frequency multiple of the reference clock signal and a means for generating at least one output clock signal having an integer frequency multiple of the reference clock signal. The clock generator further includes a means for synchronizing each output clock signal with the reference clock signal and a means for generating an offset in each output clock signal relative to the reference clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, a clock generator selects an input clock signal and generates a reference clock signal based on the selected clock signal in a phase-locked loop. Additionally, the clock generator generates clock signals, each having a frequency being a non-integer multiple of a frequency of the reference clock signal. The clock generator is capable of switching to another input clock signal during operation of the clock generator while maintaining the reference clock signal. Further, the clock generator is programmable for controlling operation of the clock circuit. In various embodiments, the clock generator includes a clock circuit implemented in an integrated circuit and a single external voltage-controlled crystal oscillator coupled to the integrated circuit.

Figure 1:
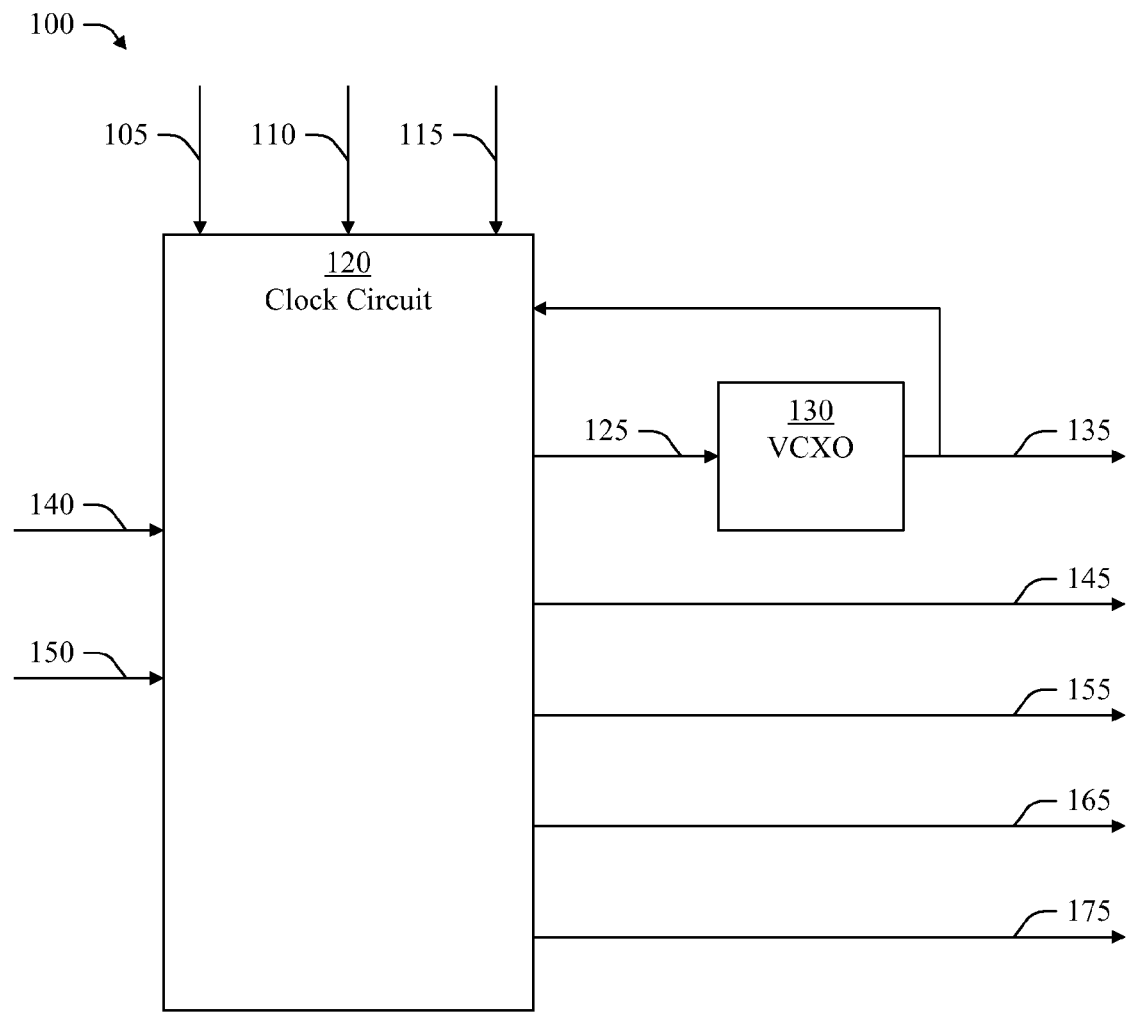
FIG. 1 is a block diagram of a clock generator, in accordance with an embodiment of the present invention.

FIG. 1 illustrates a clock generator 100, in accordance with an embodiment of the present invention. The clock generator 100 includes a clock circuit 120 and a voltage-controlled crystal oscillator (VCXO) 130 coupled to the clock circuit 120. The clock circuit 120 receives control signals 105, 110, and 115, and clock signals 135, 140 and 150, and generates a control signal 125 and clock signals 145, 155, 165, and 175. The voltage-controlled crystal oscillator 130 receives the control signal 125 from the clock circuit 120 and generates the clock signal 135 based on the control signal 125. Further, the voltage-controlled crystal oscillator 130 provides the clock signal 135 to the clock circuit 120. The clock signal 135 is a feedback clock signal of a phase-locked loop including the voltage-controlled crystal oscillator 130 and portions of the clock circuit 120, as is described more fully herein. Although only two input clock signals 140 and 150 are illustrated in the embodiment of FIG. 1, the clock generator 100 may include more than two input clock signals 140 and 150 in other embodiments.

In various embodiments, the frequency of one or more of the clock signals 145, 155, 165, and 175 is a non-integer multiple (i.e., a fractional multiple) of the frequency of the clock signal 135 and the frequency of one or more of the clock signals 145, 155, 165, and 175 is an integer multiple of the frequency of the clock signal 135. In preferred embodiments, the clock circuit 120 is embodied in an integrated circuit and the voltage-controlled crystal oscillator 130 is external of the clock circuit 120. For example, the clock circuit 120 may be embodied in a system-on-a-chip (SOC) and the voltage-controlled crystal oscillator 130 may be a crystal oscillator including a piezoelectric material, such as quartz, for generating the clock signal 135 at a precise and stable frequency. As another example, the voltage-controlled crystal oscillator 130 may be a voltage controlled SAW oscillator (VCSO).

In operation, the clock circuit 120 receives clock signals 140 and 150, selects one of the clock signals 140 or 150, generates the control signal 125 based on the selected clock signal 140 or 150, and provides the control signal 125 to the voltage-controlled crystal oscillator 130. For example, the control signal 125 may be an analog voltage or a digital signal representing an analog voltage. The voltage-controlled crystal oscillator 130 generates the clock signal 135 having a frequency based on the control signal 125 and provides the clock signal 135 to the clock circuit 120. In turn, the clock circuit 120 continues to generate the clock signal 135 based on both the selected clock signal 140 or 150 and the clock signal 135 fed back into the clock circuit 120, as is described more fully herein.

Additionally, the clock circuit 120 synchronizes the clock signals 145, 155, 165, and 175 with a reference clock to align edges of the clock signals 145, 155, 165, and 175. Further, the clock circuit 120 may generate an offset for one or more of the clock signals 145, 155, 165, and 175 based on one or more of the control signals 105, 110, and 115. In this way, the clock circuit 120 establishes a time relationship between edges of the clock signals 145, 155, 165, and 175.

In some embodiments, the clock circuit 120 is programmable via one or more of the control signal 105, 110, and 115 to select the frequency and offset for each of the clock signals 145, 155, 165, and 175. In one embodiment, the control signal 105 is a manually generated input, the control signal 115 is a hardwired input, and the control signal 110 is a communication input. An external circuit may generate the control signal 105 based on user input and provide the control signal 105 to the clock circuit 120. For example, the external circuit may be a programming device for allowing a user to manually program the clock circuit 120. An electronic device or element of an integrated circuit containing the clock circuit 120 may provide the control signal 110 to the clock circuit 120. For example, a pin of the integrated circuit connected to a voltage or ground potential may provide the control signal 110, which has the voltage potential of the pin, to the clock circuit 120. A communication link may provide the control signal 115 to the clock circuit 120. For example, the communication link may be an Inter-Integrated Circuit ($I^2C$) interface. In other embodiments, the clock circuit 120 includes the $I^2C$ interface and the control signal 115 is a command received by the $I^2C$ interface. Although three control signals 105, 110, and 115 are illustrated in FIG. 1, the clock circuit 120 may have more or fewer than three control signals 105, 110, or 115 in other embodiments.

Figure 2:
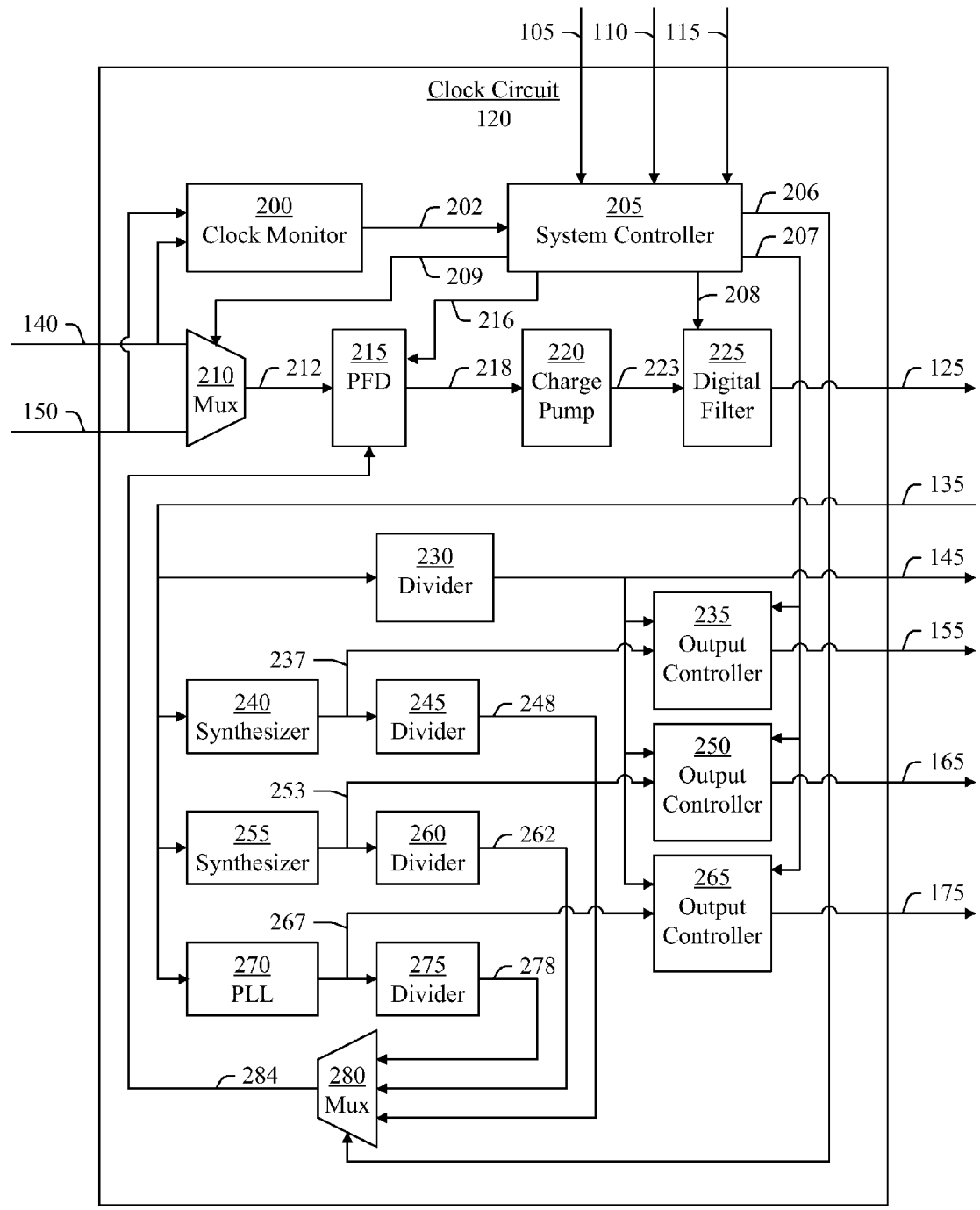
FIG. 2 is a block diagram of clock circuit, in accordance with an embodiment of the present invention.

FIG. 2 illustrates the clock circuit 120, in accordance with an embodiment of the present invention. The clock circuit 120 includes a clock monitor 200, a system controller 205, a multiplexer (Mux) 210, a phase-frequency detector (PFD) 215, a charge pump 220, and a digital filter 225. The clock monitor 200 receives the clock signals 140 and 150, selects one of the clock signals 140 or 150, generates a control signal 202 indicating the selected clock signal 140 or 150, and provides the control signal 202 to the system controller 205. The system controller 205 generates a control signal 209 indicating the selected clock signal 140 or 150 based on the control signal 202 and provides the control signal 209 to the multiplexer 210. The multiplexer 210 passes the selected clock signal 140 or 150 as a clock signal 212 based on the control signal 209 and provides the clock signal 212 to the phase-frequency detector 215. Additionally, the system controller 205 generates a control signal 208 for controlling operation of the digital filter 225, as is described more fully herein. In various embodiments, the system controller 205 generates the control signal 208 based on one or more of the control signals 105, 110, and 115.

In addition to the clock signal 212 (e.g., the selected clock signal), the phase-frequency detector 215 receives a clock signal 284, as is described more fully herein. The clock signal 284 is a feedback signal of a phase-locked loop containing the voltage-controlled crystal oscillator 130 and various components of the clock circuit 120 as is also discussed more fully herein. The phase-frequency detector 215 generates a control signal 218 indicating a phase difference between the clock signal 212 and the clock signal 284, and provides the control signal 218 to the charge pump 220. In turn, the charge pump 220 generates a control signal 223 based on the control signal 218 indicating the phase difference between the clock signal 212 and the clock signal 284. For example, the control signal 223 may be a voltage indicating the phase difference between the clock signal 212 and the clock signal 284. The charge pump 220 provides the control signal 223 to the digital filter 225.

The digital filter 225 generates the control signal 125 based on the control signal 223. In this process, the digital filter 225 converts the control signal 223 into a digital signal, processes the digital signal, converts the digital signal into an analog signal, and outputs the analog signal as the control signal 125. In some embodiments, the digital filter 225 generates the control signal 125 based on both the control signal 223 and the control signal 208. For example, the digital filter 225 may processes the control signal 223 based on parameters provided to the digital filter 225 from the system controller 205 though the control signal 208 to control bandwidth and damping of the clock signal 135.

The clock circuit 120 also includes dividers 230, 245, 260, and 275, synthesizers 240 and 255, output controllers 235, 250, and 265, a locked loop (PLL) 270, and a multiplexer (Mux) 280. The system controller 205 generates a control signal 206 and a control signal 207 based on the control signals 105, 110, and 115 received by the system controller 205. Additionally, the system controller 205 provides the control signal 206 to the multiplexer 280 for controlling operation of the multiplexer 280, as is described more fully herein. Further, the system controller 205 provides the control signal 207 to each of the output controllers 235, 250, and 265 for individually controlling operation of the output controllers 235, 250, and 265, as is also described more fully herein.

The divider 230 receives the clock signal 135 from the voltage-controlled crystal oscillator 130 and divides the frequency of the clock signal 135 by an integer value to generate the clock signal 145. Additionally, the divider 230 provides the clock signal 145 to each of the output controllers 235, 250, and 265. In turn, the output controllers 235, 250, and 265 synchronize respective clock signals 237, 253, and 267 with the clock signal 145 to generate the respective output clock signals 155, 165, and 175, as is described more fully herein. In this way, the clock signals 155, 165, and 175 generated by the output controllers 235, 250, and 265 are synchronized with each other. In various embodiments, the system controller 205 provides the control signal 207 to the output controllers 235, 250, and 265 for determining offsets of the output clock signals 155, 165, and 175 relative to the clock signal 145. For example, the system controller 205 may provide parameters, such as offset parameters, to the output controllers 235, 250, and 265 for individually controlling the offsets of the clock signals 155, 165, and 175 generated by the respective output controllers 235, 250, and 265.

The synthesizer 240 receives the clock signal 135 from the voltage-controlled crystal oscillator 130, multiplies the frequency of the clock signal 135 by a non-integer value (e.g., a fractional value) to generate the clock signal 237 (e.g., a fractional clock signal), and provides the clock signal 237 to the output controller 235. In turn, the output controller 235 generates the clock signal 155 based on the clock signal 237 received from the synthesizer 240 and the clock signal 145 received from the divider 230. In this process, the output controller 235 synchronizes the clock signal 237 with the clock signal 145, for example by aligning an edge of the clock signal 237 with an edge of the clock signal 145. Additionally, the output controller 235 may offset the clock signal 155 relative to the clock signal 145. For example, the output controller 235 may shift an edge of the clock signal 155 relative to the clock signal 145 based on an offset parameter received from the system controller 205 through the control signal 207. In various embodiments, the synthesizer 240 is a cascade fraction synthesizer (CFS).

The synthesizer 255 receives the clock signal 135 from the voltage-controlled crystal oscillator 130, multiplies the frequency of the clock signal 135 by a non-integer value (e.g., a fractional value) to generate the clock signal 253 (e.g., a fractional clock signal), and provides the clock signal 253 to the output controller 250. In turn, the output controller 250 generates the clock signal 165 based on the clock signal 253 received from the synthesizer 255 and the clock signal 145 received from the divider 230. In this process, the output controller 250 synchronizes the clock signal 253 with the clock signal 145, for example by aligning an edge of the clock signal 253 with an edge of the clock signal 145. Additionally, the output controller 250 may offset the clock signal 165 relative to the clock signal 145. For example, the output controller 250 may shift an edge of the clock signal 165 relative to the clock signal 145 based on an offset parameter received from the system controller 205 through the control signal 207. In various embodiments, the synthesizer 255 is a cascade fraction synthesizer (CFS).

The phase-locked loop 270 receives the clock signal 135 from the voltage-controlled crystal oscillator 130, multiplies the frequency of the clock signal 135 by an integer value to generate the clock signal 267 (e.g., a non-fractional clock signal), and provides the clock signal 267 to the output controller 265. In turn, the output controller 265 generates the clock signal 175 based on the clock signal 267 received from the phase-locked loop 270 and the clock signal 145 received from the divider 230. In this process, the output controller 265 synchronizes the clock signal 267 with the clock signal 145, for example by aligning an edge of the clock signal 267 with an edge of the clock signal 145. Additionally, the output controller 265 may offset the clock signal 175 relative to the clock signal 145. For example, the output controller 265 may shift an edge of the clock signal 175 relative to an edge of the clock signal 145 based on an offset parameter received from the system controller 205 through the control signal 207. In various embodiments, the phase-locked loop 270 is an analog phase-locked loop.

The divider 245 receives the clock signal 237 from the synthesizer 240 and divides the frequency of the clock signal 237 by an integer value to generate a clock signal 248 (i.e., a divided clock signal). The divider 260 receives the clock signal 253 from the synthesizer 255 and divides the frequency of the clock signal 253 by an integer value to generate a clock signal 262 (i.e., a divided clock signal). The divider 275 receives the clock signal 267 from the phase-locked loop 270 and divides the frequency of the clock signal 267 by an integer value to generate a clock signal 278 (i.e., a divided clock signal). Additionally, the dividers 245, 260, and 275 provide the respective clock signals 248, 262, and 278 to the multiplexer 280.

The multiplexer 280 receives the clock signals 248, 262, and 278 from the respective dividers 245, 260, and 275 and the control signal 206 from the system controller 205 and selects one of the clock signals 248, 262, or 278 based on the control signal 206. Additionally, the multiplexer 280 passes the selected clock signal 248, 262, or 278 as the clock signal 284 and provides the clock signal 284 to the phase-frequency detector 215.

In one embodiment, the frequency of the clock signal 135 is 10 MHz and the divider 230 divides the frequency of the clock signal 135 by twelve-thousand-five-hundred to generate the clock signal 145 having a frequency of 800 Hz. The synthesizer 240 generates the clock signal 237 having a frequency of 1966.08 MHz and the output controller 235 generates the clock signal 155 having a frequency of 1966.08 MHz. The synthesizer 255 generates the clock signal 253 having a frequency of 61.44 MHz and the output controller 250 generates the clock signal 165 having a frequency of 61.44 MHz. The phase-locked loop 270 generates the clock signal 267 having a frequency of 2500 MHz and the output controller 265 generates the clock signal 175 having a frequency of 2500 MHz.

It is to be appreciated that the clock generator 100 has application in a distributed third-generation (3G) NodeB remote radio unit (RRU). Because the clock generator 100 only needs a single voltage-controlled crystal oscillator 130 to generate the clock signals 135, 145, 155, 165, and 175, the cost and part count of the clock generator 100 is reduced. Moreover, using a single voltage-controlled crystal oscillator 130 improves performance of the clock generator 100 because each of the clock signals 145, 155, 165, and 175 is derived from the clock signal 135 and synchronized to the clock signal 135. In one embodiment, the clock circuit 120 is implemented in an integrated circuit, such as a system-on-chip (SOC). This further reduces the cost and part count of the clock generator 100 and improves the performance of the clock generator 100. For example, implementing the clock circuit 120 in an integrated circuit allows components of the clock circuit 120, such as the output controllers 235, 250, and 265, to be matched in performance over process, voltage, and temperature variations of the integrated circuit. In one embodiment, the clock circuit 120 is implemented in a single semiconductor die.

Although two synthesizers 240 and 255 are illustrated in the embodiment of FIG. 2, the clock circuit 120 may have more or fewer than two synthesizers 240 or 255 in other embodiments for generating more or fewer than two clock signals 237 and 253 (e.g., fractional clock signals). Although one phase-locked loop 270 is illustrated in the embodiment of FIG. 2, the clock circuit 120 may have more than one phase-locked loop 270 in other embodiments for generating more than one clock signal 267 (e.g., a non-fractional clock signal). In some embodiments, the phase-locked loop 270, the divider 275, and the output controller 265 are optional.

Figure 3:
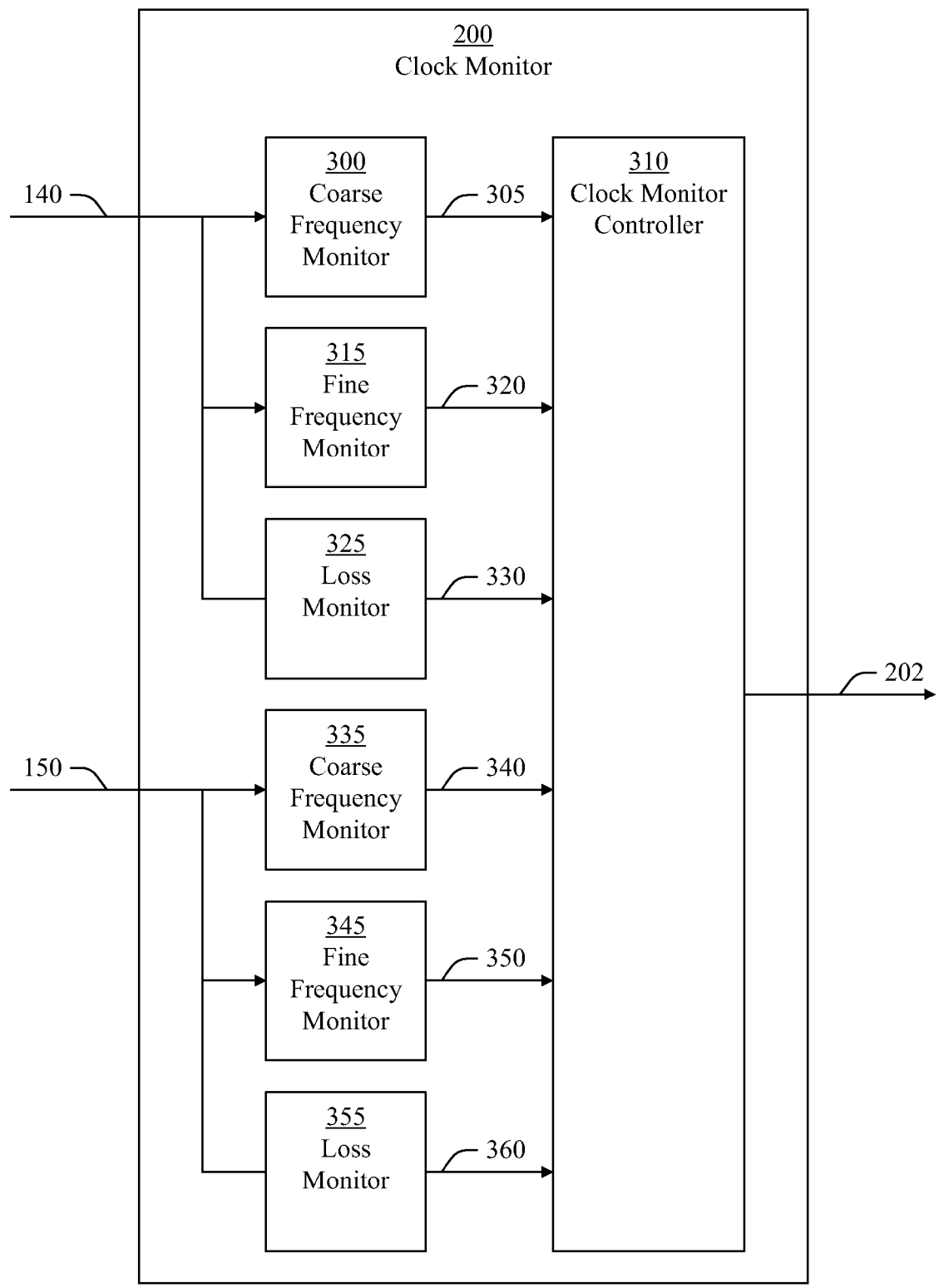
FIG. 3 is a block diagram of a clock monitor, in accordance with an embodiment of the present invention.

FIG. 3 illustrates the clock monitor 200, in accordance with an embodiment of the present invention. The clock monitor 200 includes coarse frequency monitors 300 and 335, fine frequency monitors 315 and 345, loss monitors 325 and 355, and a clock monitor controller 310. The coarse frequency monitors 300 and 335 receive the respective clock signals 140 and 150, and each of the coarse frequency monitors 300 and 335 monitors the received clock signal 140 or 150 to identify coarse variations in the frequency of the received clock signal 140 or 150. For example, each of the coarse frequency monitors 300 and 335 may monitor the received clock signal 140 or 150 to detect a predetermined percentage of the variation of the frequency of the received clock signal 140 or 150. Additionally, the coarse frequency monitors 300 and 335 generate respective control signals 305 and 340 indicating coarse variations in the frequencies of the respective clock signals 140 and 150 and provide the respective control signals 305 and 340 to the clock monitor controller 310.

The fine frequency monitors 315 and 345 receive the respective clock signals 140 and 150, and each of the fine frequency monitors 315 and 345 monitors the received clock signal 140 or 150 to identify fine variations in the frequency of the received clock signal 140 or 150. For example, each of the fine frequency monitors 315 and 345 may monitor the received clock signal 140 or 150 to detect a predetermined percentage of the variation of the frequency of the received clock signal 140 or 150, which is less than the percentage of variation detected by the coarse frequency monitors 300 and 335. Additionally, the fine frequency monitors 315 and 345 generate respective control signals 320 and 350 indicating fine variations in the frequencies of the respective clock signals 140 and 150 and provide the respective control signals 320 and 350 to the clock monitor controller 310.

The loss monitors 325 and 355 receive the respective clock signals 140 and 150, and each of the loss monitors 325 and 355 monitors the received clock signal 140 or 150 to identify loss of the received clock signal 140 or 150. For example, each of the loss monitors 325 and 355 may monitor the received clock signal 140 or 150 to determine whether the voltage of the received clock signal 140 or 150 is outside of a predetermined voltage range. Additionally, the loss monitors 325 and 355 generate respective control signals 330 and 360 indicating losses (e.g., voltage losses) of the respective clock signals 140 and 150 and provide the respective control signals 330 and 360 to the clock monitor controller 310.

The clock monitor controller 310 selects one of the clock signals 140 or 150 based on the control signals 305, 320, 330, 340, 350, and 360. In various embodiments, the clock monitor controller 310 includes control circuitry for performing an algorithm based on the control signals 305, 320, 330, 340, 350, and 360 to select the clock signal 140 and 150 having preferred characteristics. For example, the clock monitor controller 310 may perform the algorithm to select the clock signal 140 or 150 by identifying the clock signal 140 or 150 having greater stability or the more precise frequency. Additionally, the clock monitor controller 310 generates the control signal 202 indicating the selected clock signal 140 or 150 and provides the control signal 202 to the system controller 205.

Figure 4:
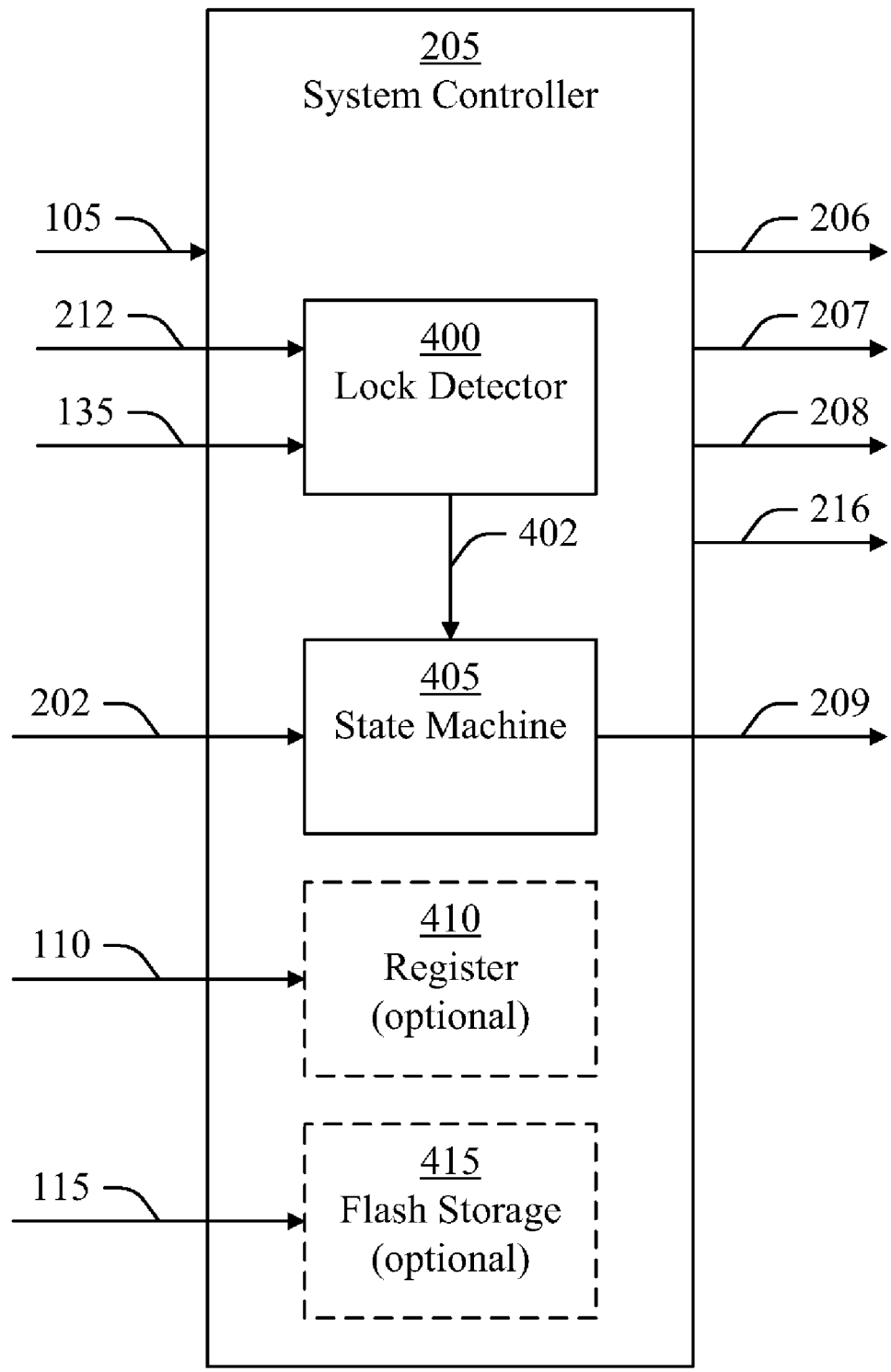
FIG. 4 is a block diagram of a system controller, in accordance with an embodiment of the present invention.

FIG. 4 illustrates the system controller 205, in accordance with an embodiment of the present invention. The system controller 205 receives the clock signals 212 and 135 and the control signals 105, 110, 115, and 202, and generates the control signals 206, 207, 208, and 209 based on the control signals 105, 110, 115, 202 and 218, as is described more fully herein. The system controller 205 includes a state machine 405 that generates the control signal 209 based on the control signal 202 received from the clock monitor 200. The control signal 209 indicates the clock signal 140 or 150 selected by the clock monitor 200, which is also indicated in the control signal 202. Additionally, the state machine 405 generates the control signal 209 to sequence a transition between the clock signals 140 and 150 if the control signal 202 indicates that the selected clock signal 140 or 150 has changed. In some embodiments, the system controller 205 generates a control signal 216 for controlling operation of the phase-frequency detector 215 and provides the control signal 216 to the phase-frequency detector 215.

In one embodiment, the state machine 405 includes a free-run state, a locked state, and a holdover state. In the free-run state, the clock generator 100 locks the frequency of the selected clock signal 140 or 150 to the frequency of the clock signal 284. Further, the clock circuit 120 includes a lock detector 400 for determining whether the frequency of the selected clock signal 140 or 150 (e.g., the clock signal 212) is locked to the frequency of the clock signal 135. Further, the lock detector 400 generates a lock signal 402 indicating whether the frequency of the selected clock signal 140 or 150 is locked to the frequency of the clock signal 135 and provides the lock signal 402 to the state machine 405. If the lock signal 402 indicates that the frequency of the selected clock signal 140 or 150 is locked to the frequency of the clock signal 135 and the state machine 405 is in the free-run state, the state machine 405 transitions from the free-run state to the locked state. In one embodiment, the lock detector 400 determines whether the selected clock signal 140 or 150 is locked to the clock signal 135 based on the clock signal 212 and the clock signal 284.

If the control signal 202 indicates a change in the selected clock signal 140 or 150, the state machine 405 transitions into the hold state. In the hold state, the system controller 205 provides the control signal 208 to the digital filter 225 indicating that the selected clock signal 140 or 150 has changed. In response to the control signal 208, the digital filter 225 maintains the control signal 125 (e.g., voltage) at its present level such that the frequency of the clock signal 135 is maintained. Also in the hold state, the state machine 405 provides the control signal 209 to the multiplexer 210 indicating the newly selected clock signal 140 or 150. The state machine 405 then transitions into the free-run state, for example after a time-delay or in response to a signal from the phase-frequency detector 215 indicating the clock signal 212 has changed. In the free-run state, the state machine 405 provides the control signal 208 to the digital filter 225 indicating the digital filter 225 need no longer maintain the control signal 125 at its present level (e.g., voltage). The state machine 405 then transitions from the free-run state into the locked state in response to the lock signal 402 indicating that the frequency of the selected clock signal 140 or 150 is locked to the frequency of the clock signal 284. In other embodiments, the state machine 405 may include different states for sequencing the transition from a selected clock signal 140 or 150 to newly selected clock signal 140 or 150, and the clock circuit 120 may include other components or circuits for generating the lock signal 402.

In various embodiments, the system controller 205 includes an optional register 410 or an optional flash storage 415, or both. The register 410 receives data, such as parameters, via the control signal 110 and stores the data. In turn, the system controller 205 reads the data in the register 410 to configure the clock circuit 120. For example, the system controller 205 may generate the control signal 206 based on the data in the register 410 to select the clock signal 248, 262, or 278 to pass as the clock signal 284. As another example, the system controller 205 may generate the control signal 207 to select offsets for the clock signals 155, 165, and 175 generated by the respective output controllers 235, 250, and 265.

The flash storage 415 receives data, such as parameters, via the control signal 115 and stores the data. For example, a programming device may provide the control signal 115 to the flash storage 415 during manufacture of the clock circuit 120 for storing data in the flash storage 415. The system controller 205 reads the data in the flash storage 415 to configure the clock circuit 120, for example by selecting the clock signal 248, 262, or 278 to pass through the multiplexer 280 as the clock signal 284 or selecting offsets for the clock signals 155, 165, and 175.

Figure 5:
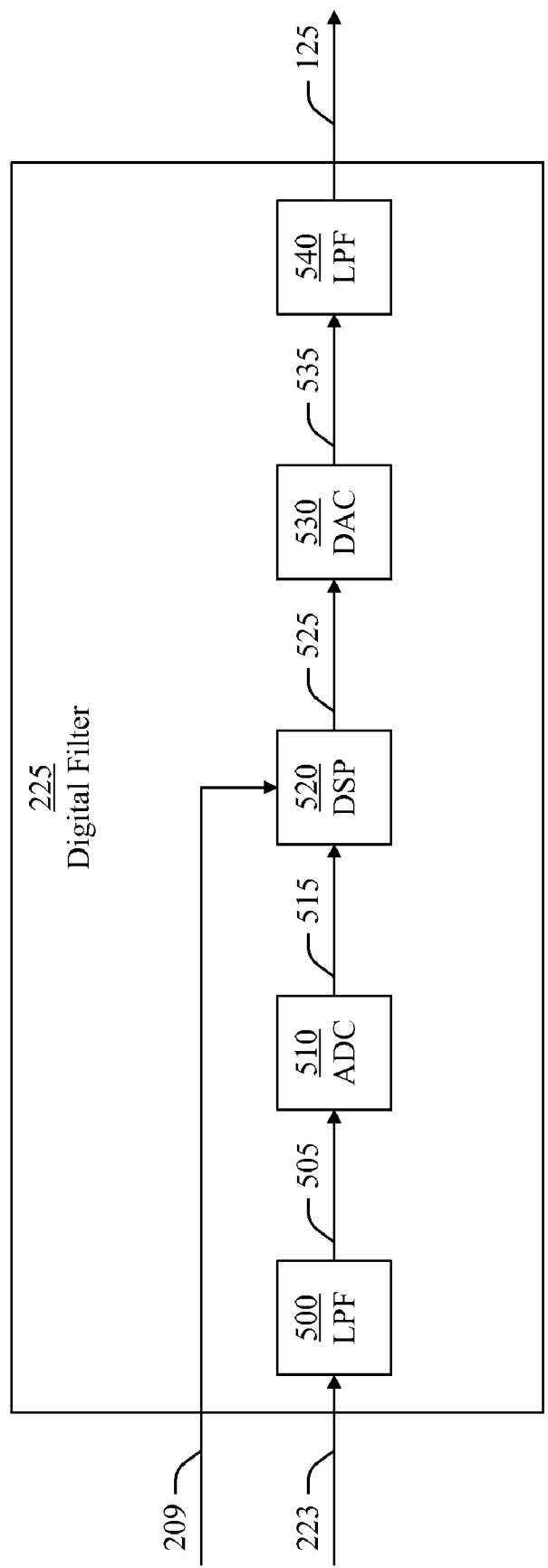
FIG. 5 is a block diagram of a digital filter, in accordance with an embodiment of the present invention.

FIG. 5 illustrates the digital filter 225, in accordance with an embodiment of the present invention. The digital filter 225 includes a low-pass filter (LPF) 500, an analog-to-digital converter (ADC) 510, a digital signal processor (DSP) 520, a digital-to-analog converter (DAC) 530, and a low-pass filter (LPF) 540. The low-pass filter 500 receives the control signal 223 from the charge pump 220, generates a control signal 505 by filtering higher frequency components from the control signal 223, and provides the control signal 505 to the analog-to-digital converter 510. In turn, the analog-to-digital converter 510 converts the control signal 505 to a digital control signal 515 and provides the digital control signal 515 to the digital signal processor 520. The digital signal processor 520 processes the digital control signal 515, generates a control signal 525 based on the digital control signal 515, and provides the control signal 525 to the digital-to-analog converter 530. The digital signal processor 520 may process the digital control signal 515, for example, to optimize parameters of the clock circuit 120. The digital-to-analog converter 530 converts the control signal 525 to an analog control signal 535 and provides the analog control signal 535 to the low-pass filter 540. The low-pass filter 540 generates the control signal 125 by filtering higher frequency components from the analog control signal 535.

Figure 6:
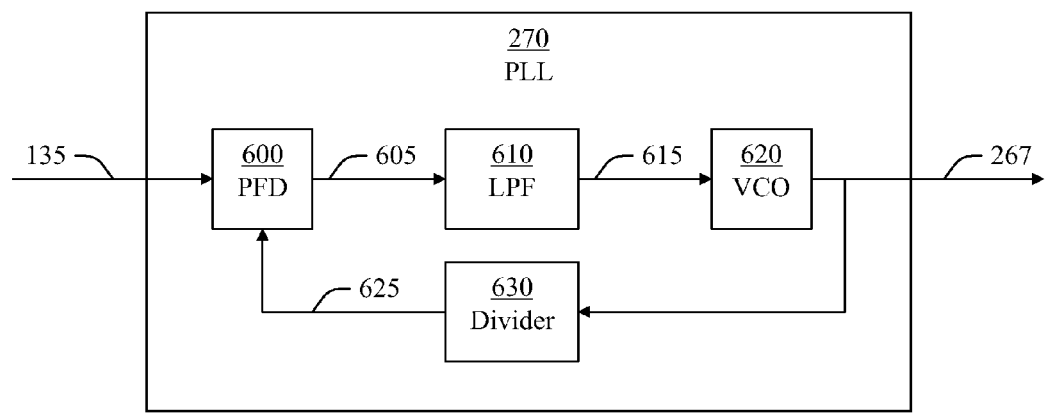
FIG. 6 is a block diagram of a phase-locked loop, in accordance with an embodiment of the present invention.

FIG. 6 illustrates the phase-locked loop 270, in accordance with an embodiment of the present invention. The phase-locked loop 270 includes a phase-frequency detector (PFD) 600, a low-pass filter (LPF) 610, a voltage-controlled oscillator (VCO) 620, and a divider 630. The phase-frequency detector 600 generates a control signal 605 indicating a phase difference between the clock signal 135 and a clock signal 625 generated by the divider 630. The low-pass filter 610 generates the control signal 615 by filtering higher frequency components from the control signal 605. For example, the control signal 615 may be a voltage indicating the phase difference between the clock signal 135 and the clock signal 625. The voltage-controlled oscillator 620 generates the clock signal 267 based on the control signal 615. The divider 630 divides the frequency of the clock signal 267 to generate the clock signal 625.

Figure 7:
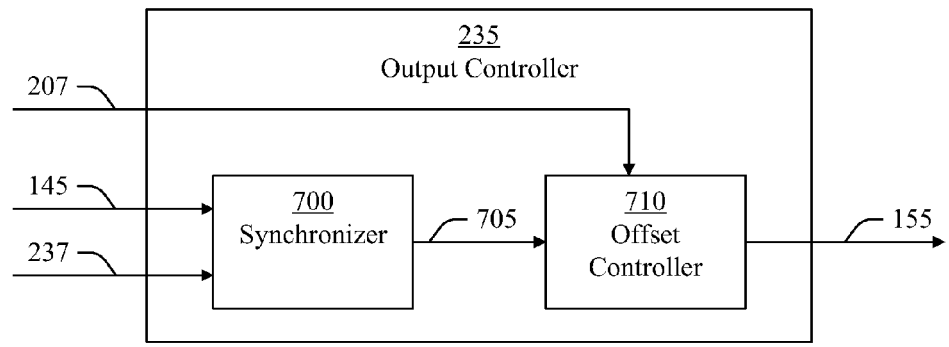
FIG. 7 is a block diagram of an output controller, in accordance with an embodiment of the present invention.

FIG. 7 illustrates the output controller 235, in accordance with an embodiment of the present invention. The output controller 235 includes a synchronizer 700 and an offset controller 710. The synchronizer 700 receives the clock signal 145 and the clock signal 237 and generates the clock signal 705 by synchronizing the clock signal 237 to the clock signal 145. For example, the synchronizer 700 may synchronize an edge of the clock signal 237 to an edge of the clock signal 145. The offset controller 710 generates the clock signal 155 by introducing an offset in the clock signal 705 based on the control signal 207. In some embodiment, the output controllers 250 and 265 have components similar to the components of the output controller 235 and function in a similar manner as the output controller 235.

Figure 8:
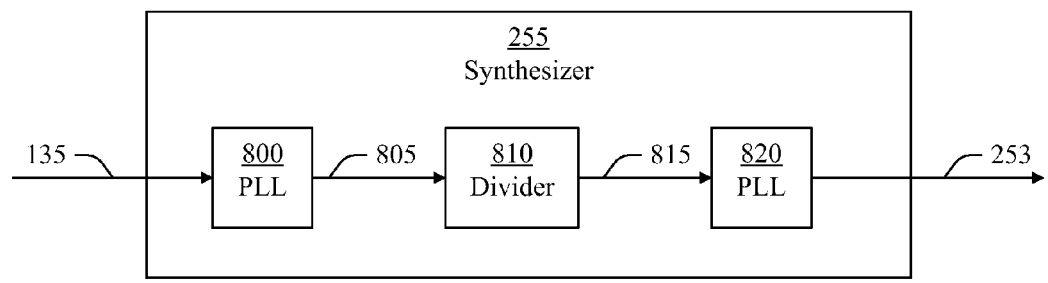
FIG. 8 is a block diagram of a synthesizer, in accordance with an embodiment of the present invention.

FIG. 8 illustrates the synthesizer 255, in accordance with an embodiment of the present invention. In this embodiment, the synthesizer 255 is a cascade fraction synthesizer. The synthesizer 255 includes a phase-locked loop (PLL) 800, a divider 810, and a phase-locked loop (PLL) 820. The phase-locked loop 800 multiples the frequency of the clock signal 135 by an integer value to generate a clock signal 805. The divider 810 divides the frequency of the clock signal 805 by an integer value to generate a clock signal 815. The phase-locked loop 820 multiplies the clock signal 815 by an integer value to generate the clock signal 253. The integer values used to generate the clock signal 805 are selected such that the frequency of the clock signal 253 is a non-integer multiple of the frequency of the clock signal 135. In one embodiment, the frequency of the clock signal 135 is 10 MHz, the frequency of the clock signal 805 is 2560 MHz (e.g., 10 MHz multiplied by 256), the frequency of the clock signal 815 is 10.24 MHz (e.g., 2560 MHz divided by 250), and the frequency of the clock signal 253 is 2211.84 MHz (e.g., 10.24 MHz multiplied by 216). In some embodiments, the synthesizer 240 has components similar to the components of the synthesizer 255 and functions in a similar manner as the synthesizer 255.

Figure 9:
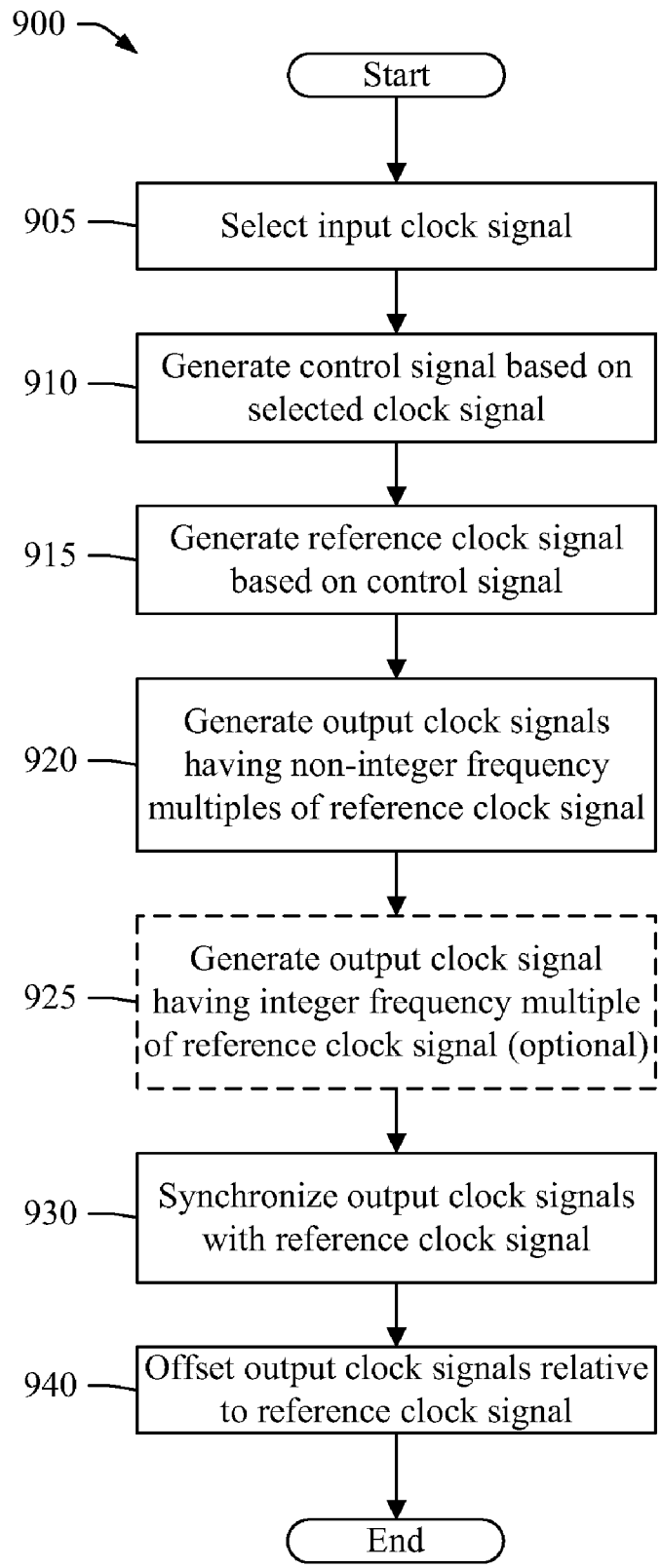
FIG. 9 is a flow chart of a method of generating clock signals, in accordance with an embodiment of the present invention.

FIG. 9 illustrates a method 900 of generating clock signals, in accordance with an embodiment of the present invention. In step 905, an input clock signal is selected. In one embodiment, the clock circuit 120 selects the clock signal 140 or 150 as the input clock signal. The method 900 then proceeds to step 910.

In step 910, a control signal is generated based on the selected clock signal. In one embodiment, the clock circuit 120 generates the control signal 125 based on the selected clock signal 140 or 150. The method 900 then proceeds to step 915.

In step 915, a reference clock signal is generated based on the control signal. In one embodiment, the clock generator 100 generates the clock signal 135 as a reference clock signal based on the control signal 125. In this embodiment, the voltage-controlled crystal oscillator 130 generates the clock signal 135 based on the control signal 125 and the divider 230 divides the frequency of the clock signal 135 to generate the clock signal 145. The method 900 then proceeds to step 920.

In step 920, output clock signals having non-integer frequency multiples of the reference clock signal are generated. In one embodiment, the synthesizer 240 generates the clock signal 237 based on the clock signal 135. The frequency of the clock signal 237 is a non-integer multiple of the frequency of the clock signal 135. Further, the synthesizer 255 generates the clock signal 253 based on the clock signal 135. The frequency of the clock signal 253 is a non-integer multiple of the frequency of the clock signal 135. The method 900 then proceeds to step 925.

In optional step 925, an output clock signal having an integer frequency multiple of the reference clock signal is generated. In one embodiment, the phase-locked loop 270 generates the clock signal 267. The frequency of the clock signal 267 is an integer multiple of the frequency of the clock signal 135. The method 900 then proceeds to step 930.

In step 930, the output clock signals are synchronized with the reference clock signal. In various embodiments, the clock circuit 120 synchronizes the clock signals 237 and 253 with the clock signal 135. In embodiments including the phase-locked loop 270, the clock circuit 120 also synchronizes the clock signal 267 with the clock signal 145. In one embodiment, the output controllers 235, 250, and 265 synchronize the respective clock signals 237, 253, and 267 with the clock signal 135. The method 900 then proceeds to step 940.

In step 940, the output clock signals are offset relative to the reference clock signal. In one embodiment, the clock circuit 120 offsets the clock signals 237 and 253 relative to the clock signal 145. In embodiments including the phase-locked loop 270, the clock circuit 120 also generates an offset for the clock signal 267. In one embodiment, the output controllers 235, 250, and 265 generate the offsets of the respective clock signals 237, 253, and 267 relative to the clock signal 145. The method 900 then ends.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A clock generator comprising:
    a voltage-controlled oscillator configured to generate a reference clock signal having a frequency based on an input clock signal; and
    a clock circuit coupled to the voltage-controlled oscillator and configured to form a first phase-locked loop in conjunction with the voltage-controlled oscillator, the clock circuit comprising:
        a first synthesizer coupled to the voltage-controlled oscillator and configured to generate a first fractional clock signal based on the reference clock signal, the first fractional clock signal having a frequency being a non-integer multiple of the frequency of the reference clock signal; and
        a first output controller coupled to the first synthesizer and configured to generate a first output clock signal by synchronizing the first fractional clock signal with the reference clock signal and introducing an offset in the first output clock signal relative to the reference clock signal.

2. The clock generator of claim 1, further comprising a first divider coupled to the voltage-controlled oscillator and configured to generate a second output clock signal having a frequency based on the reference clock signal, the frequency of the reference clock signal being an integer multiple of the frequency of the second output clock signal, wherein the first output controller is further configured to synchronize the first fractional clock signal with the reference clock signal by synchronizing the first fractional clock signal with the second output clock signal.

3. The clock generator of claim 1, wherein the clock circuit further comprises a clock monitor coupled to the first phase-locked loop and configured to monitor a plurality of input clock signals for identifying frequency variations and loss in the plurality of clock signals and select the input clock signal from the plurality of input clock signals based on the frequency variations and the loss.

4. The clock generator of claim 1, wherein the first phase-locked loop comprises a digital filter.

5. The clock generator of claim 4, wherein the digital filter comprises a digital signal processor configured to determine a bandwidth of the reference clock signal.

6. The clock generator of claim 4, wherein the digital filter comprises a digital signal processor configured to determine a damping of the reference clock signal.

7. The clock generator of claim 1, wherein the first synthesizer is a cascade fraction synthesizer.

8. The clock generator of claim 1, wherein the clock circuit is embodied in an integrated circuit.

9. The clock generator of claim 8, wherein the voltage-controlled oscillator is a voltage-controlled crystal oscillator external of the integrated circuit.

10. The clock generator of claim 9, wherein the voltage-controlled crystal oscillator is a voltage-controlled SAW oscillator.

11. The clock generator of claim 1, further comprising:
    a system controller configured to generate a control signal indicating a feedback clock signal of the first phase-locked loop;
    a second synthesizer coupled to the voltage-controlled oscillator and configured to generate a second fractional clock signal based on the reference clock signal, the second fractional clock signal having a frequency being a non-integer multiple of the frequency of the reference clock signal;
    a second output controller coupled to the second synthesizer and configured to generate a third output clock signal by synchronizing the second fractional clock signal with the reference clock signal and introducing an offset in the third output clock signal relative to the reference clock signal;
    a second divider coupled to the first synthesizer and configured to generate a first divided clock signal having a frequency based on the first fractional clock signal, the first fractional clock signal having a frequency being an integer multiple of the frequency of the first divided clock signal;
    a third divider coupled to the second synthesizer and configured to generate a second divided clock signal having a frequency based on the second fractional clock signal, the second fractional clock signal having a frequency being an integer multiple of the frequency of the second divided clock signal; and a multiplexer coupled to the second divider, the third divider, and the first phase-locked loop, the multiplexer configured to select either the first divided clock signal or the second divided clock signal as the feedback clock signal based on the control signal and provide the feedback clock signal to the first phase-locked loop.

12. The clock generator of claim 1, further comprising a system controller configured to generate a control signal indicating a feedback clock signal of the first phase-locked loop;

a second phase-locked loop coupled to the voltage-controlled oscillator and configured to generate a non-fractional clock signal based on the reference clock signal, the non-fractional clock signal having a frequency being an integer multiple of the frequency of the reference clock signal; and a third output controller coupled to the second phase-locked loop and configured to generate a fourth output clock signal by synchronizing the non-fractional clock signal with the reference clock signal and introducing an offset in the fourth output clock signal relative to the reference clock signal;

a second divider coupled to the first synthesizer and configured to generate a first divided clock signal having a frequency based on the first fractional clock signal, the first fractional clock signal having a frequency being an integer multiple of the frequency of the first divided clock signal;

a fourth divider coupled to the second phase-locked loop and configured to generate a third divided clock signal having a frequency based on the non-fractional clock signal, the non-fractional clock signal having a frequency being an integer multiple of the frequency of the third divided clock signal; and a multiplexer coupled to the second divider, the fourth divider, and the first phase-locked loop, the multiplexer configured to select either the first divided clock signal or the third divided clock signal as the feedback clock signal based on the control signal and provide the feedback clock signal to the first phase-locked loop.

13. A method of generating clock signals, the method comprising:

generating a control signal based on an input clock signal;

generating a reference clock signal having a frequency based on the control signal;

generating a first fractional clock signal based on the reference clock signal, the first fractional clock signal having a frequency being a non-integer multiple of the frequency of the reference clock signal; and generating a first output clock signal by synchronizing the first fractional clock signal with the reference clock signal and introducing an offset in the first output clock signal relative to the reference clock signal.

14. The method of claim 13, further comprising generating a second fractional clock signal based on the reference clock signal, the second fractional clock signal having a frequency being a non-integer multiple of the frequency of the reference clock signal; and generating a third output clock signal by synchronizing the second fractional clock signal with the reference clock signal and introducing an offset in the third output clock signal relative to the reference clock signal.

15. The method of claim 13, further comprising generating a non-fractional clock signal based on the reference clock signal, the non-fractional clock signal having a frequency being an integer multiple of the frequency of the reference clock signal; and generating a fourth output clock signal by synchronizing the non-fractional clock signal with the reference clock signal and introducing an offset in the fourth output clock signal relative to the reference clock signal.

16. The method of claim 13, further comprising:

monitoring a plurality of clock signals to identify frequency variations and loss in the plurality of clock signals; and selecting the input clock signal from the plurality of input clock signals based on the identified frequency variations and loss.

17. A clock generator comprising:

means for generating a control signal based on an input clock signal;

means for generating a reference clock signal based on the control signal;

means for generating a first fractional clock signal based on the reference clock signal, the first fractional clock signal having a frequency being a non-integer multiple of the frequency of the reference clock signal; and means for generating a first output clock signal by synchronizing the first fractional clock signal with the reference clock signal and introducing an offset in the first output clock signal relative to the reference clock signal.

18. The clock generator of claim 17, further comprising:

means for generating a second fractional clock signal based on the reference clock signal, the second fractional clock signal having a frequency being a non-integer multiple of the frequency of the reference clock signal; and means for generating a third output clock signal by synchronizing the second fractional clock signal with the reference clock signal and introducing an offset in the third output clock signal relative to the reference clock signal.

19. The clock generator of claim 18, further comprising means for generating a non-fractional clock signal based on the reference clock signal, the non-fractional clock signal having a frequency being an integer multiple of the frequency of the reference clock signal; and means for generating a fourth output clock signal by synchronizing the non-fractional clock signal with the reference clock signal and introducing an offset in the fourth output clock signal relative to the reference clock signal.

20. The clock generator of claim 17, further comprising:

means for monitoring a plurality of clock signals to identify frequency variations and loss in the plurality of clock signals; and means for selecting the input clock signal from the plurality of input clock signals based on the frequency variations and loss.

* * * * *

UNITED STATES PATENT AND TRADEMARK OFFICE
CERTIFICATE OF CORRECTION

PATENT NO.         : 7,573,303 B1                                    Page 1 of 1
APPLICATION NO.    : 11/781452
DATED              : August 11, 2009
INVENTOR(S)        : Chi et al.

It is certified that error appears in the above-identified patent and that said Letters Patent is hereby corrected as shown below:

Column 5, line 15 the word "locked" should read --phase-locked--.

Signed and Sealed this

Twentieth Day of April, 2010

David J. Kappos
*Director of the United States Patent and Trademark Office*